US012808034B2

(12) United States Patent
Govindasamy et al.

(10) Patent No.: US 12,808,034 B2
(45) Date of Patent: Nov. 24, 2026

(54) ADJUSTABLE CLAMP FOR PHYSICAL VAPOR DEPOSITION

(71) Applicant: Applied Materials, Inc., Santa Clara, CA (US)

(72) Inventors: Sathiyamurthi Govindasamy, Coimbatore (IN); Harish V. Penmethsa, Dublin, CA (US); Suresh Palanisamy, Coimbatore (IN); Dinesh Rajamanickam, Coimbatore (IN)

(73) Assignee: Applied Materials, Inc., Santa Clara, CA (US)

( * ) Notice: Subject to any disclaimer, the term of this patent is extended or adjusted under 35 U.S.C. 154(b) by 704 days.

(21) Appl. No.: 18/313,733

(22) Filed: May 8, 2023

(65) Prior Publication Data

US 2024/0376591 A1 Nov. 14, 2024

(51) Int. Cl.
*C23C 14/50* (2006.01)
*H10P 72/76* (2026.01)

(52) U.S. Cl.
CPC .......... *C23C 14/50* (2013.01); *H10P 72/7606* (2026.01); *H10P 72/7608* (2026.01)

(58) Field of Classification Search
CPC ......... H01L 21/68721; H01L 21/68728; C23C 14/50
USPC ............... 118/728–732, 50, 503; 204/298.15
See application file for complete search history.

(56) References Cited

U.S. PATENT DOCUMENTS 3,645,622 A * 2/1972 Cachon ............... G03F 7/70691 356/399
4,306,731 A * 12/1981 Shaw .................. H10P 72/7608 269/254 R
4,473,455 A 9/1984 Dean et al.
4,779,877 A * 10/1988 Shaw .................. H10P 72/7608 269/254 R
4,817,556 A * 4/1989 Mears ................. H10P 72/7608 269/254 R
4,978,412 A 12/1990 Aoki et al.
(Continued)

FOREIGN PATENT DOCUMENTS

JP 02198151 A 8/1990
KR 200173947 Y1 3/2000
TW 200704805 A 2/2007

OTHER PUBLICATIONS

International Search Report/ Written Opinion issued to PCT/US2024/010997 on May 17, 2024.
(Continued)

*Primary Examiner* — Jason L Vaughan
(74) *Attorney, Agent, or Firm* — Patterson + Sheridan, LLP

(57) ABSTRACT

Embodiments of the disclosure provided herein include an apparatus for securing a substrate in a plasma processing system. The apparatus includes a clamp assembly having a main clamp, a sub-clamp having a tapered inner edge, a gasket disposed within the sub-clamp, the gasket being proximate to the tapered inner edge having a gasket contact surface configured to contact a substrate, and a leaf spring secured to the sub-clamp by at least one of a plurality of fasteners. In another embodiment, a clamp assembly has a main clamp, a sub-clamp having a tapered inner edge, the sub-clamp secured to the main clamp by a fastener, a gasket having a gasket contact surface, and a compression spring disposed coaxially about the fastener.

11 Claims, 18 Drawing Sheets

(56) References Cited

U.S. PATENT DOCUMENTS

| | | | | | |
|---|---|---|---|---|---|
| 5,040,484 | A * | 8/1991 | Mears | H10P 72/7608 | 269/254 R |
| 5,094,885 | A * | 3/1992 | Selbrede | C23C 16/4585 | 118/724 |
| 5,253,411 | A * | 10/1993 | DiNapoli | H10P 72/7608 | 269/254 R |
| 5,267,607 | A * | 12/1993 | Wada | H10P 72/7606 | 118/724 |
| 5,458,322 | A * | 10/1995 | Kulkaski | H10P 72/7608 | 269/254 R |
| 5,513,594 | A * | 5/1996 | McClanahan | H10P 72/7608 | 269/254 R |
| 5,657,975 | A * | 8/1997 | Szapucki | H10P 72/7608 | 269/254 R |
| 5,868,847 | A * | 2/1999 | Chen | H10P 72/7606 | 118/715 |
| 6,039,854 | A | 3/2000 | Liu | | |
| 6,287,385 | B1 * | 9/2001 | Kroneberger | H10P 72/7608 | 269/254 R |
| 6,416,647 | B1 * | 7/2002 | Dordi | H10P 72/7606 | 204/278 |
| 6,761,362 | B2 | 7/2004 | Noguchi | | |
| 7,601,248 | B2 * | 10/2009 | Yoshioka | C25D 17/001 | 204/297.06 |

OTHER PUBLICATIONS

Taiwanese Office Action for Application No. 113101484 dated Mar. 3, 2026.

* cited by examiner

ADJUSTABLE CLAMP FOR PHYSICAL VAPOR DEPOSITION

BACKGROUND

Field

Embodiments of the present invention generally relate to semiconductor substrate processing equipment. More particularly, the present disclosure relates to a method and apparatus for securing a substrate on a substrate support.

Description of the Related Art

Physical vapor deposition (PVD) is a widely used process for creating thin films on substrates in a variety of industrial and research applications. The process involves the use of physical effects, such as evaporation or ion bombardment, to force source atoms into a gaseous phase and then deposit them on a substrate to form a thin film. The PVD process typically involves heating or ionizing the source material, which is then directed toward the substrate in a vacuum chamber. The substrate is supported in the chamber on a support member. The substrate is placed on, and secured to, the upper surface of the support member prior to the deposition or etch process.

The substrate may be biased, or electrically charged, to accelerate the ions toward its surface, where they deposit and form a thin film. During the PVD process, it is essential to secure the substrate in place to ensure that it remains stable and does not move or shift during the deposition process.

Clamps may be used in PVD chambers to secure the substrate to the support member. The clamps are designed to provide a tight grip on the substrate to prevent any unwanted movement that could affect the uniformity of the deposited film. However, care must be exercised when securing a substrate so that the substrate is not damaged by the clamp. Clamps may be positioned both laterally and vertically relative to the substrate to reduce the risk of damage under the weight of the clamp. Even with this arrangement, clamps may exert too much force when securing the substrate that the substrate may be damaged.

Further, the use of gaskets in clamps to secure the substrate can contribute to the contamination of the substrate. Gaskets can become contaminated with impurities such as hydrocarbon molecules from poorly trapped oil diffusion pumps, organic gaskets, or grease used on gaskets. This contamination can lead to the release of impurities back into the PVD chamber during the deposition process, which can then contaminate the substrate.

Moreover, the use of clamps in PVD chambers could also contribute to the shadowing effect, a phenomenon where the deposition of material on a substrate is blocked by an object in the path of the vapor stream, resulting in a shadow being cast on the substrate. The clamps themselves can create a physical barrier that blocks the vapor stream and causes the shadowing effect. Additionally, the size and position of the clamps can also affect the shadowing effect by casting shadows on the substrate and blocking the deposition of material in certain areas.

Accordingly, there is a need for an improved apparatus and method of securing a substrate to a substrate support during a PVD process.

SUMMARY

Embodiments described herein generally relate to systems and methods used for forming tungsten features in a semiconductor device. More particularly, embodiments herein provide for processes and methods to depassivate a tungsten passivation layer to allow faster tungsten growth in a subsequent tungsten growth step.

In an embodiment, a clamp assembly for securing a substrate in a processing chamber is provided. The clamp assembly includes a main clamp, a sub-clamp having a tapered inner edge, a gasket disposed within the sub-clamp, the gasket being proximate to the tapered inner edge having a gasket contact surface configured to contact a substrate, and a leaf spring secured to the sub-clamp by at least one of a plurality of fasteners.

In another embodiment, a clamp assembly configured to secure a substrate to the substrate support is provided. The clamp assembly has a main clamp, a sub-clamp having an inner edge that is tapered, a gasket disposed within a sub-clamp recess of the sub-clamp, a leaf spring in direct contact with the gasket and the main clamp, and a plurality of fasteners.

In yet another embodiment, a clamp assembly for securing a substrate to a substrate support is provided. The clamp assembly includes a main clamp, a sub-clamp having a tapered inner edge, the sub-clamp secured to the main clamp by a fastener, a gasket having a gasket contact surface, and a compression spring disposed coaxially about the fastener.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein are generally directed to semiconductor substrate processing equipment. More particularly, the present disclosure relates to a method and apparatus for securing a substrate on a substrate support during physical vapor deposition. Embodiments provided herein include improved systems and methods for securing a substrate to a substrate support using a clamp assembly.

During physical vapor deposition (PVD), clamps are essential to secure the substrate, preventing unwanted movement that could result in non-uniform deposition. However, clamps may exert too much force when securing the substrate which leads to substrate damage. Clamps may also contribute to the shadowing effect within a chamber as the clamps may be an obstacle in the vapor stream. The size and position of the clamps may block deposition of material in areas of the substrate where deposition is desired. Further, gaskets used in clamps to secure the substrate may contribute to contamination of the substrate. Gaskets may become contaminated with impurities which may be released into the PVD chamber and onto the substrate.

Accordingly, the present disclosure provides a technical solution to the problems described above by providing systems and methods for improved securing of a substrate during a PVD process by using a clamp assembly that includes a main clamp, a sub-clamp, and different spring arrangements. The sub-clamp is secured to the main clamp either directly, via the spring, or a combination of both. The sub-clamp includes a gasket comprising of a polymer material such as polyetheretherketone (PEEK) with a contact surface that contacts the substrate. The contact surface of the gasket is wide enough to reduce the pressure placed on the substrate when securing it while maintaining the force required to maintain the position of the substrate on the substrate support. The PEEK material of the gasket also reduces the contamination that the gasket contributes to the substrate surface. The sub-clamp also includes a tapered nose on an inner edge closest to the substrate. The tapered nose on the inner edge reduces the shadowing effect on the edges of the substrate, prevents cracking and arcing of the sub-clamp with the substrate, and reduces the amount of deposition on the gasket.

Figure 1A:
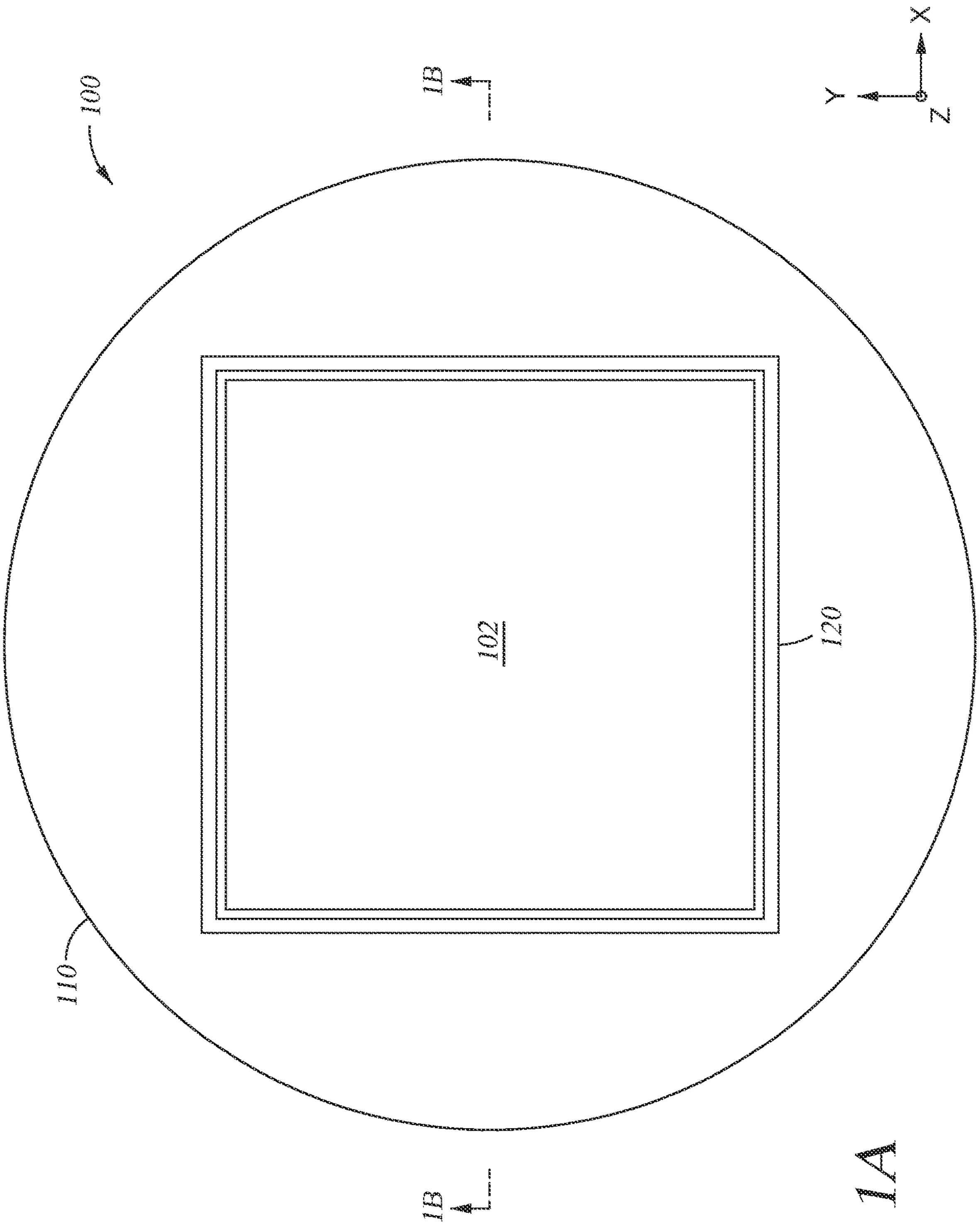
FIG. 1A shows a top view of a clamp assembly, according to certain embodiments.
Figure 1B:
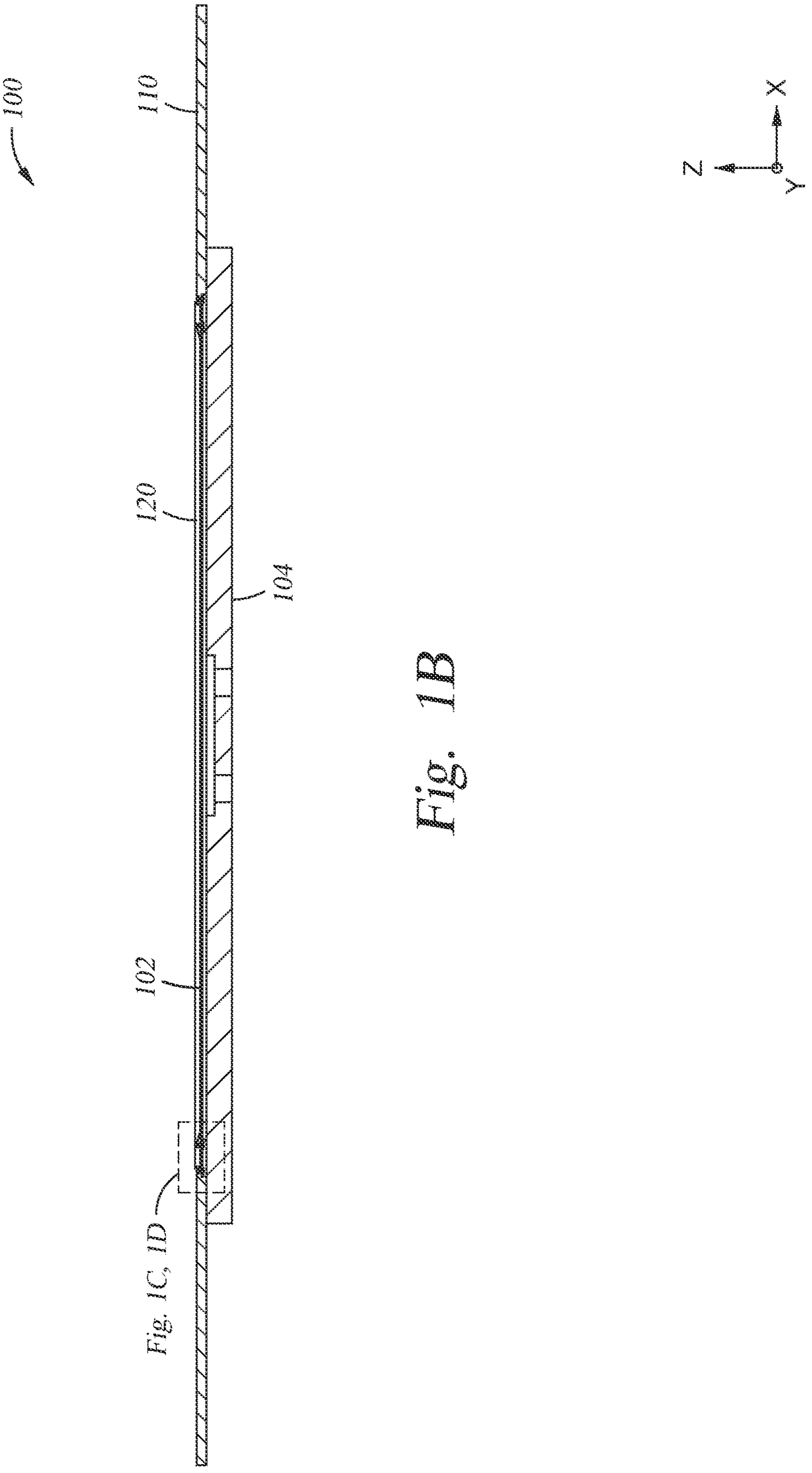
FIG. 1B shows a cross-sectional view of the clamp assembly of FIG. 1A, according to certain embodiments.

FIG. 1A shows a top view of a clamp assembly 100, and FIG. 1B shows a cross-sectional view of the clamp assembly 100 of FIG. 1A, according to certain embodiments. FIGS. 1A and 1B show the clamp assembly 100 as part of a substrate processing system, where the clamp assembly 100 is configured to hold a substrate 102 to a substrate support 104 of the substrate processing system during a deposition process, such as PVD. The clamp assembly 100 includes a main clamp 110 and a sub-clamp 120.

Figure 1C:
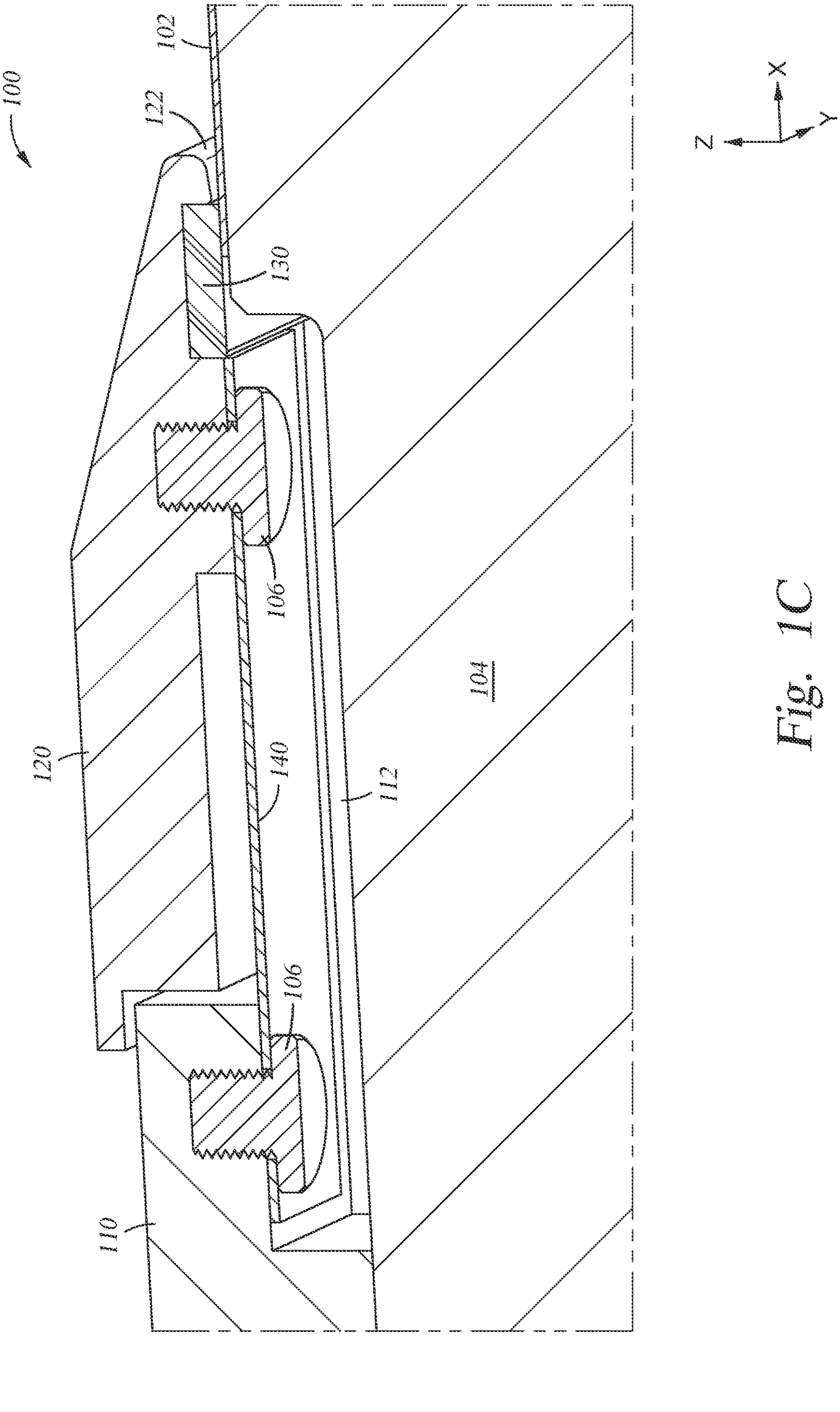
FIG. 1C shows a close-up perspective cross-sectional view of the clamp assembly of FIG. 1A, according to certain embodiments.
Figure 1D:
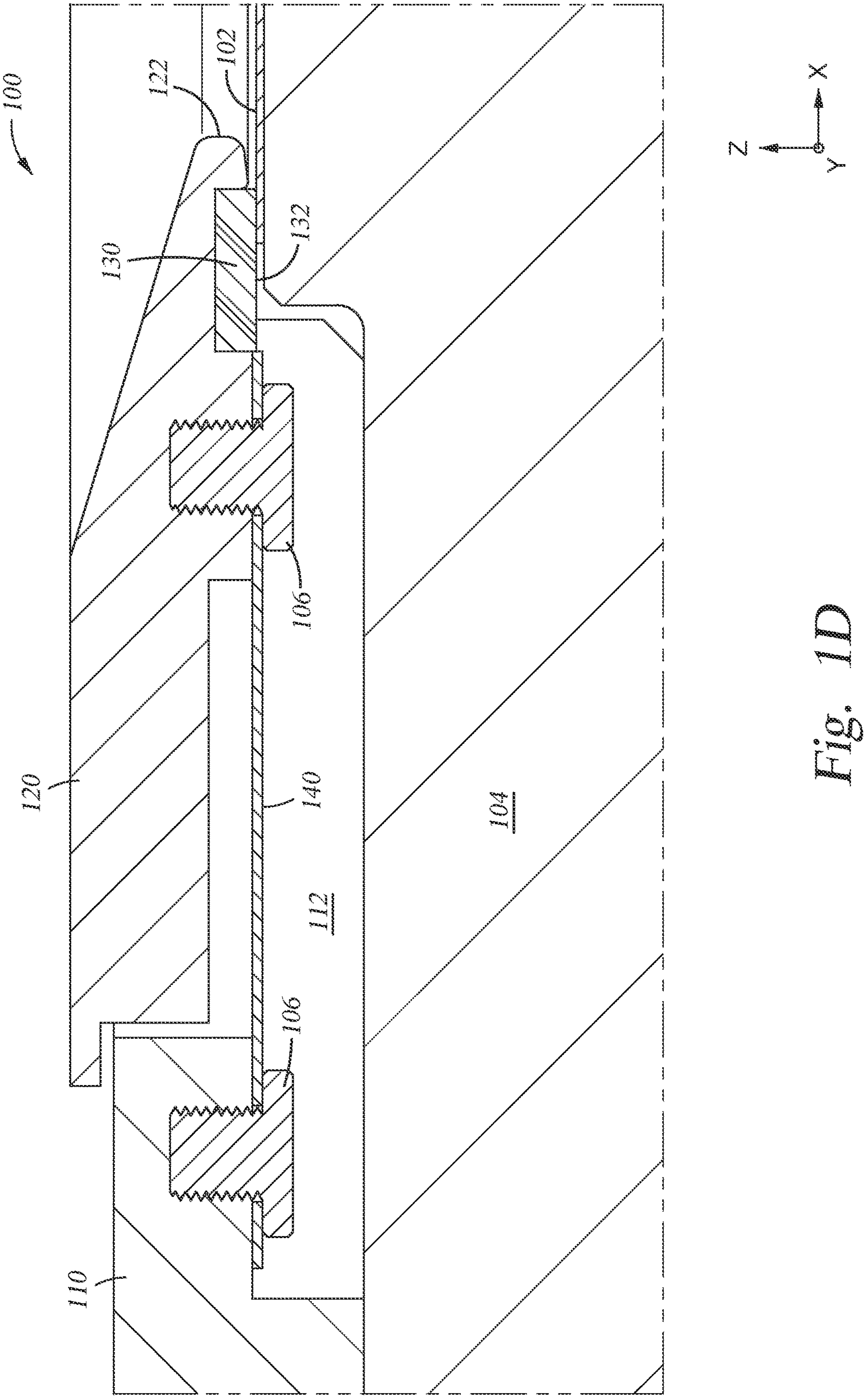
FIG. 1D shows a close-up cross-sectional view of the clamp assembly of FIG. 1A, according to certain embodiments.

FIG. 1C shows a close-up perspective cross-sectional view of the clamp assembly 100, and FIG. 1D shows a close-up cross-sectional view of the clamp assembly 100 from the view C-D of FIG. 1B. As shown in FIGS. 1C and 1D, the sub-clamp 120 is disposed on the main clamp 110. One end of a leaf spring 140 is attached to the main clamp 110 via at least one of a plurality of fasteners 106 and an opposing end of the leaf spring 140 is attached to the sub-clamp 120 via at least another of the plurality of fasteners 106. The sub-clamp 120 includes an inner edge 122.

The sub-clamp 120 includes a gasket 130 disposed within the sub-clamp 120 proximate to the tapered inner edge 122 that is configured to contact the substrate 102 when the sub-clamp 120 is engaged. The inner edge 122 is tapered and rounded such that the inner edge 122 does not contact the substrate 102 when the sub-clamp 120 is engaged in securing the substrate 102. The inner edge 122 leaves a gap between the inner edge 122 and the substrate 102 that is small, such as between about 0.1 mm and about 0.5 mm, such as between about 0.2 mm and about 0.4 mm, such as about 0.3 mm, which protects the gasket 130 from unnecessary deposition on the gasket 130, reducing gasket particle contamination and extending the life of the gasket 130. The tapered inner edge 122 helps avoid arcing and reduces the shadowing effect of the clamp assembly 100 during the PVD process.

The gasket 130 comprises a polymer such as PEEK and includes a gasket contact surface 132 such that the width of the gasket contact surface 132 is greater than the cross-sectional height of the gasket 130. The increased width of the gasket contact surface 132 provides a wider contact surface for the substrate 102. This increased contact surface allows for the force applied to the substrate 102 to remain the same while substantially reducing the pressure applied to the substrate 102. This reduced pressure prevents cracking or other damage to the substrate 102 by the clamp assembly 100. Additionally, the polymer composition of the gasket 130 reduces particle generation during the deposition process.

The main clamp 110 includes a slot 112 corresponding to the shape of the leaf spring 140. When the main clamp 110 is lowered onto the substrate support 104 to secure the substrate 102, the sub-clamp 120 engages the substrate 102 via the gasket 130 and the leaf spring 140 deforms to allow the sub-clamp 120 to displace vertically.

When the gasket 130 contacts the substrate 102, the substrate 102 places an upward force on the gasket 130 and the sub-clamp 120, causing the sub-clamp 120 to displace vertically upward. As the sub-clamp 120 displaces, the sub-clamp 120 displaces upward causing the leaf spring 140 deform relative to the slot 112. As the sub-clamp 120 continues to move upward, the leaf spring 140 then applies a reactive spring force downward through the fastener 106 to the sub-clamp 120 and the gasket 130 and subsequently to the substrate 102. This reactive spring force then secures the substrate 102 to the substrate support 104. The reactive spring force is strong enough to secure the substrate 102 without damaging it. The leaf spring 140 along with the sub-clamp 120 allows for the clamp assembly 100 to adjust to different thickness substrates, such as between about 0.2 mm to about 1.2 mm. The height of the clamp assembly 100 is also reduced by using the sub-clamp 120 and leaf spring 140 configuration, with heights about 5.5 mm or less from the substrate surface, to allow more uniform deposition on the substrate 102 near the clamp assembly 100 (e.g., the inner edge 122).

Figure 1E:
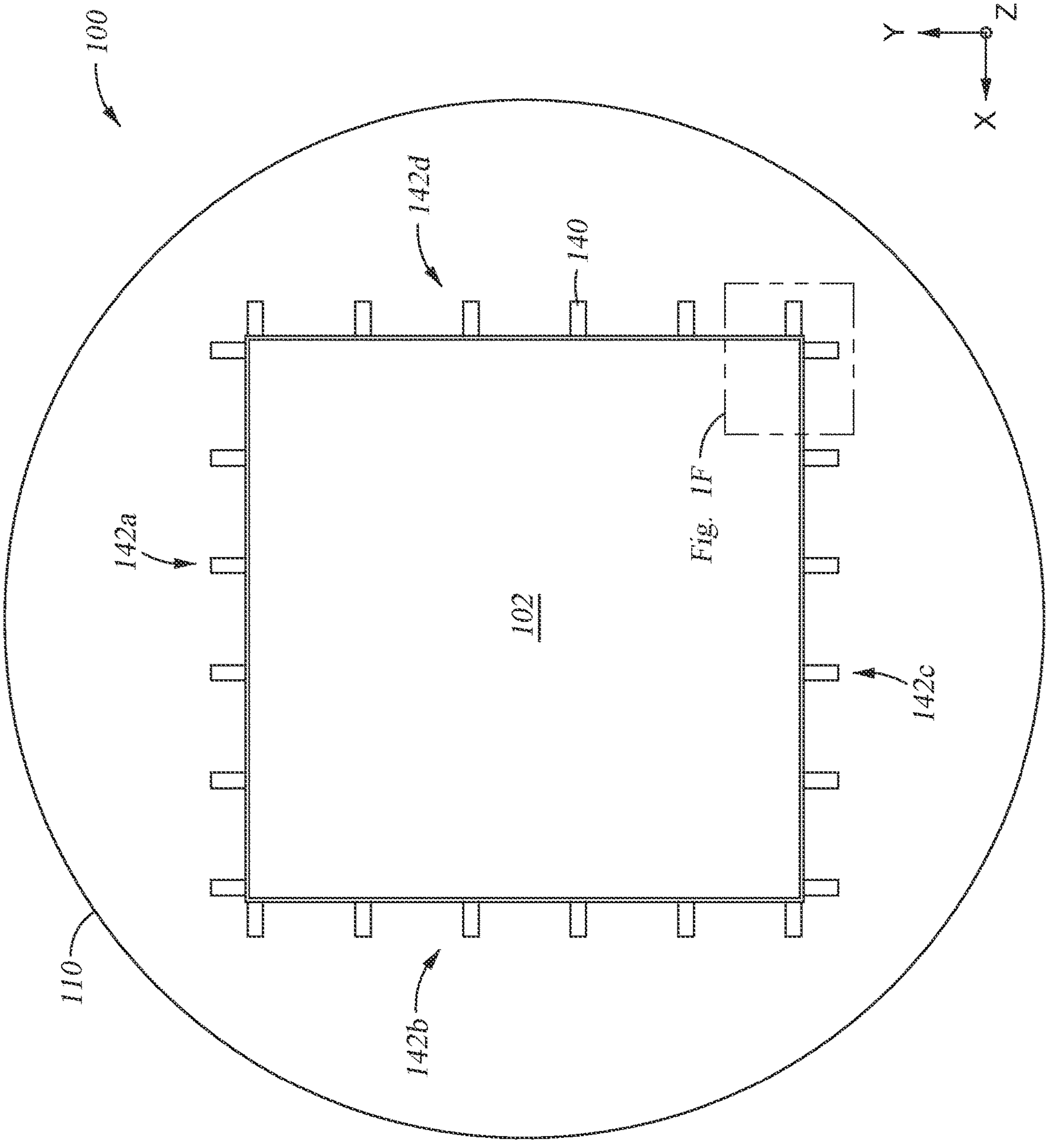
FIG. 1E shows a bottom view of the clamp assembly of FIG. 1A, according to certain embodiments.

FIG. 1E shows a bottom view of the clamp assembly 100, according to certain embodiments. As shown in FIG. 1E, the bottom surface of the clamp assembly 100 may include a plurality of leaf springs 140 arranged in arrays 142*a*, 142*b*, 142*c*, 142*d* along all of the edges of the substrate 102. The amount of leaf springs 140 in each array 142*a*, 142*b*, 142*c*, 142*d* may be preferably between 1 and about 20, preferably between about 5 and about 15, preferably about 10.

Figure 1F:
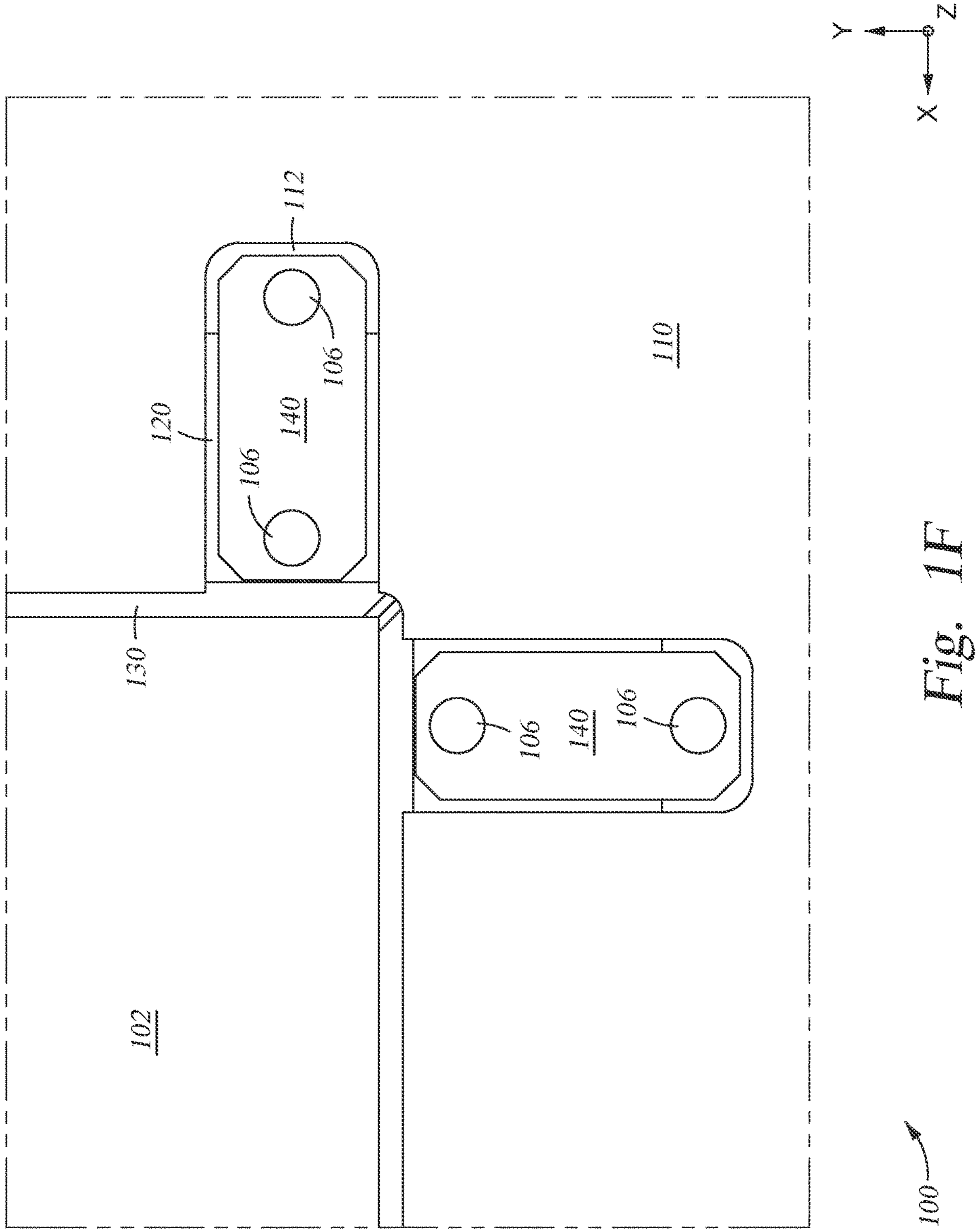
FIG. 1F shows a close-up bottom view of the clamp assembly of FIG. 1A, according to certain embodiments.

FIG. 1F shows a close-up view of a portion of the bottom surface of the clamp assembly 100. Each of the leaf springs 140 in the arrays 142*a*, 142*b*, 142*c*, 142*d* are arranged in the slots 112 such that the length, the greater of the three dimensions of the leaf spring 140, is perpendicular or normal to the inner edge 122 of the sub-clamp and a corresponding proximate edge of the substrate 102.

When the gasket 130 contacts the substrate 102, the substrate 102 places an upward force on the gasket 130 and the sub-clamp 120, causing the sub-clamp 120 to displace vertically upward. As the sub-clamp 120 displaces, the sub-clamp 120 displaces upward causing the leaf spring 140 deform relative to the slot 112. As the sub-clamp 120 continues to move upward, the leaf spring 140 then applies a reactive spring force downward through the fastener 106 to the sub-clamp 120 and the gasket 130 and subsequently to the substrate 102. This reactive spring force then secures the substrate 102 to the substrate support 104. The reactive spring force is strong enough to secure the substrate 102 without damaging it.

Figure 2A:
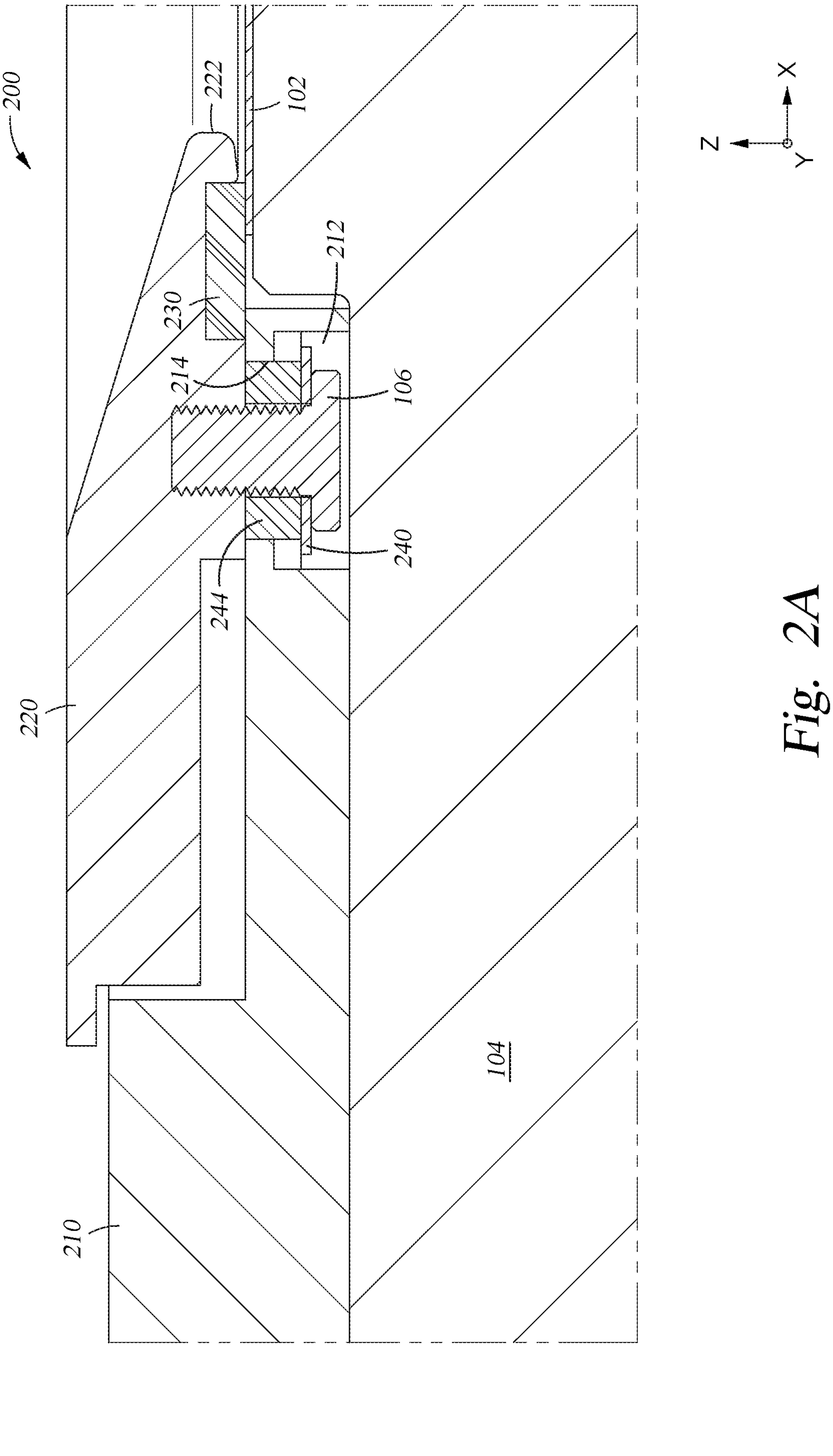
FIG. 2A shows a cross-sectional view of a clamp assembly, according to certain embodiments.
Figure 2B:
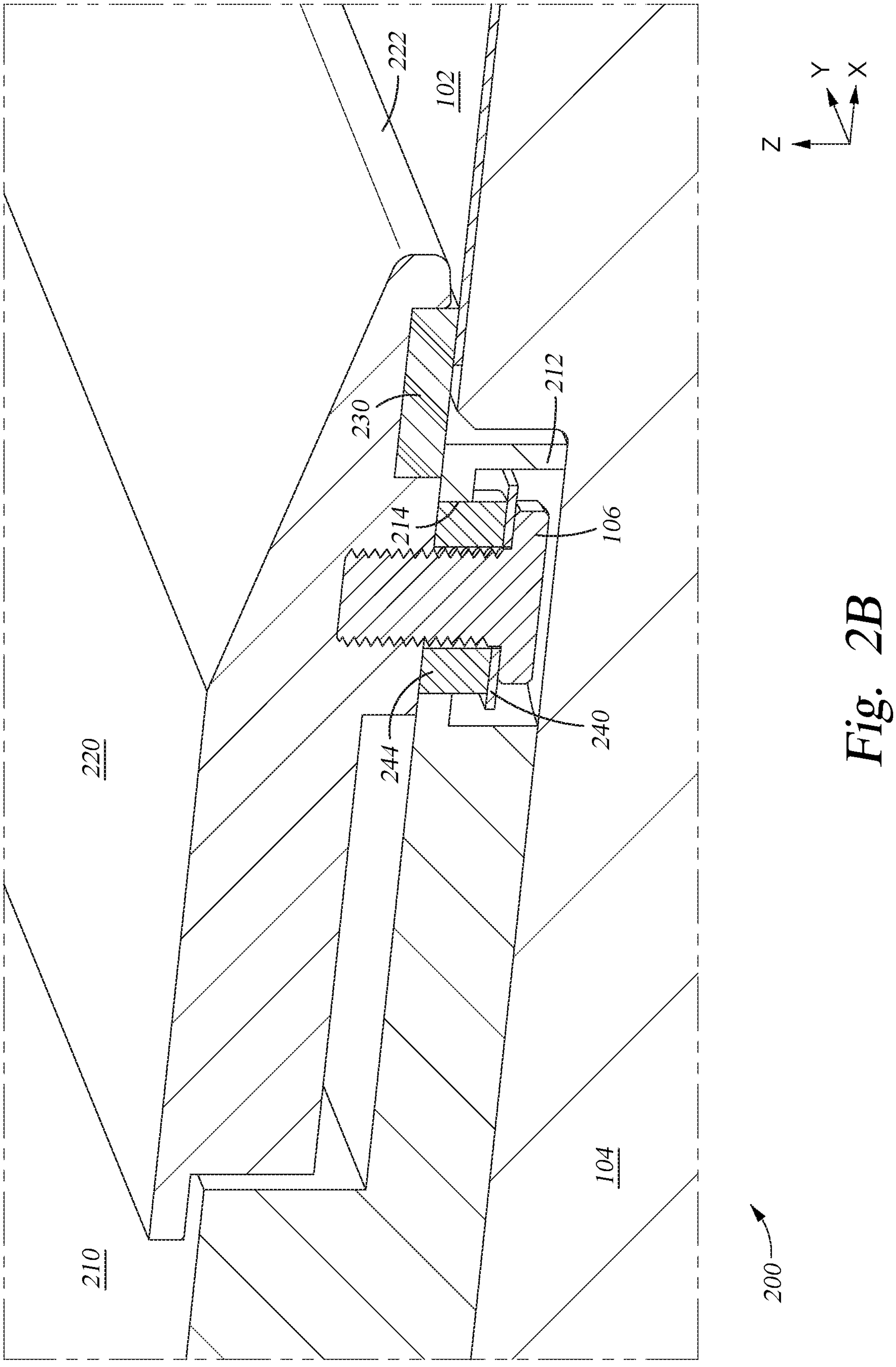
FIG. 2B shows a perspective cross-sectional view of the clamp assembly of FIG. 2A, according to certain embodiments.
Figure 2C:
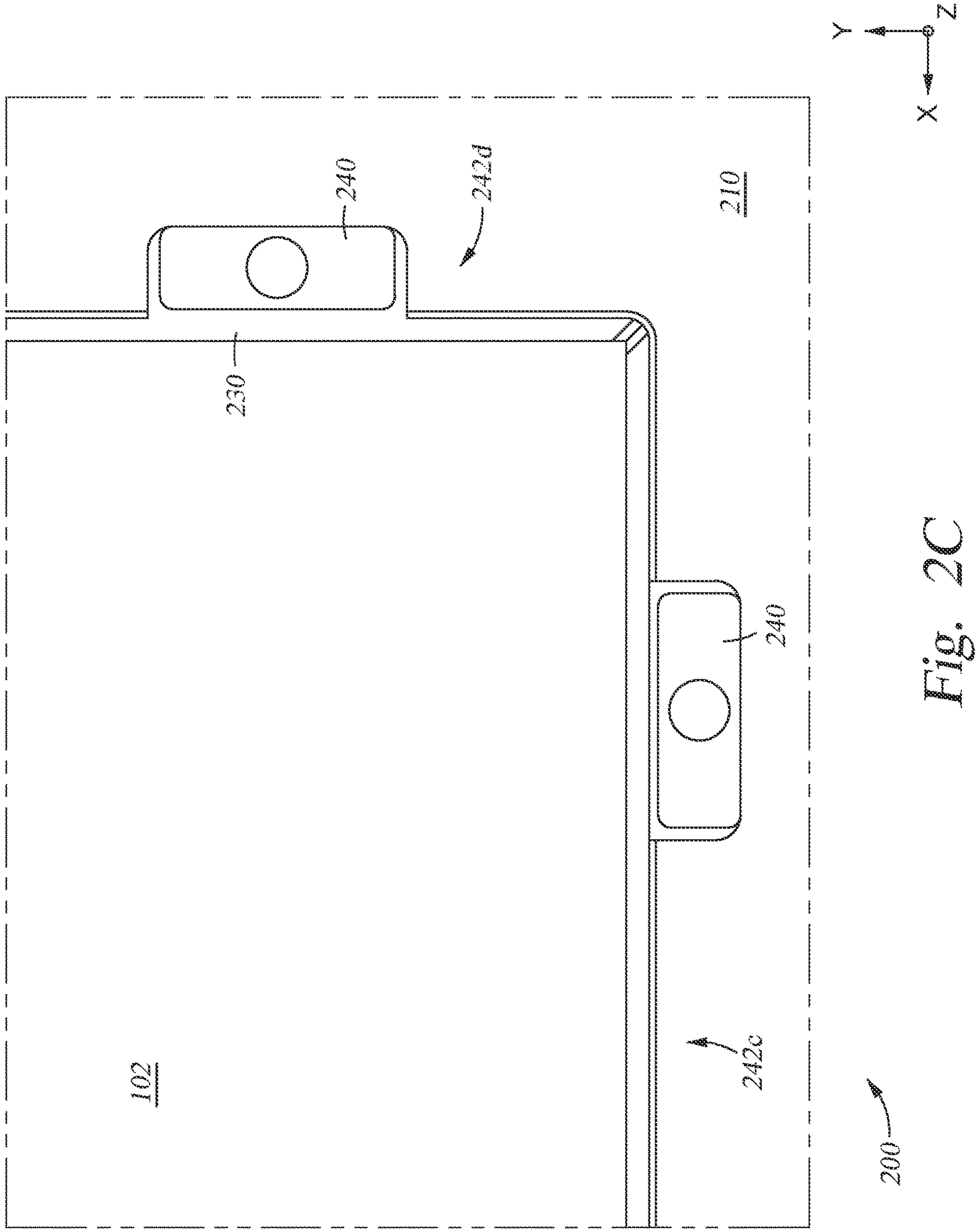
FIG. 2C shows a close-up bottom view of the clamp assembly of FIG. 2A, according to certain embodiments.
Figure 2D:
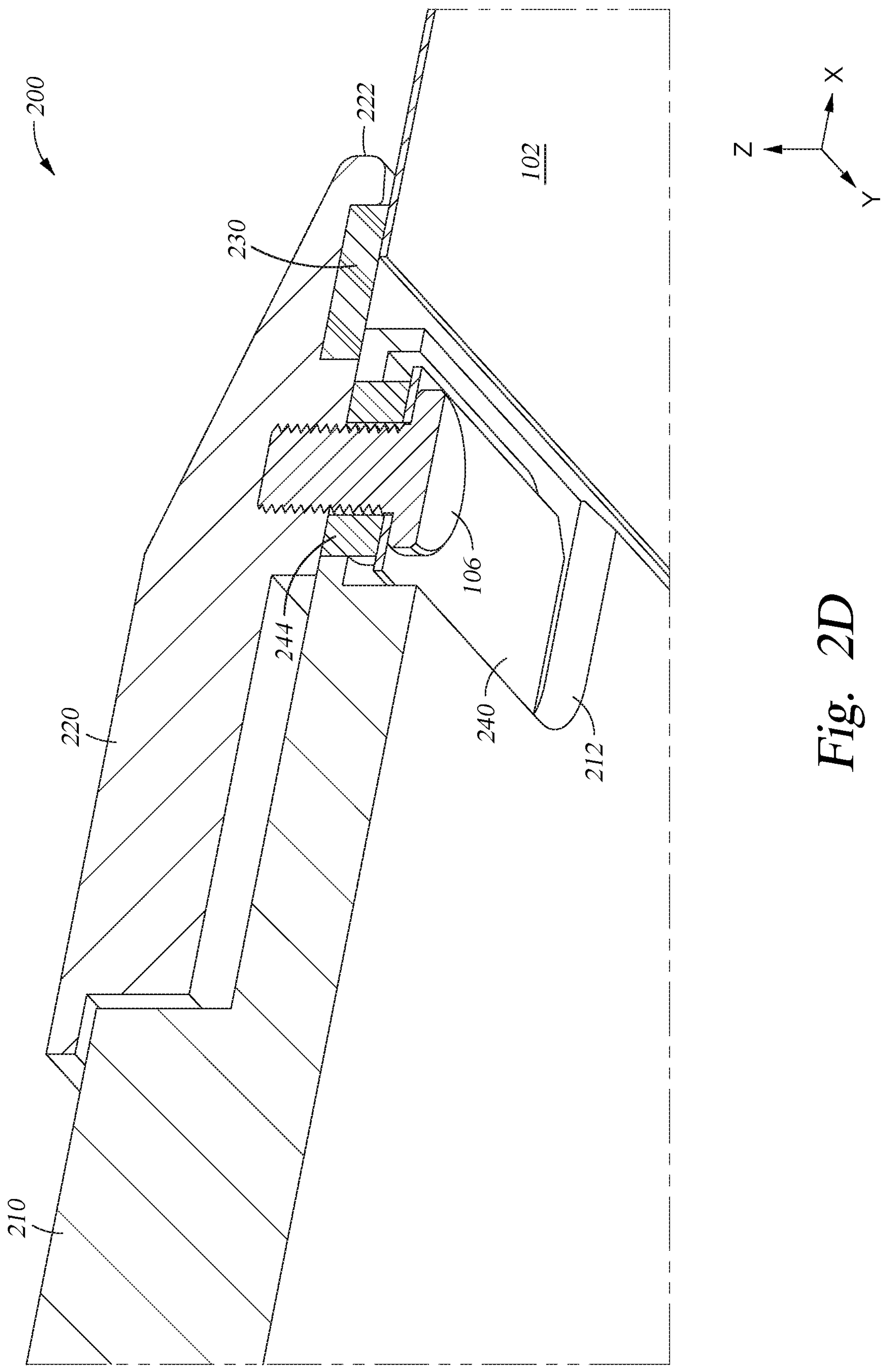
FIG. 2D shows a bottom perspective cross-sectional view of the clamp assembly of FIG. 2A, according to certain embodiments.

FIG. 2A shows a cross-sectional view of a clamp assembly 200, FIG. 2B shows a perspective cross-sectional view of the clamp assembly 200 of FIG. 2A, FIG. 2C shows a close-up bottom view of the clamp assembly 200 of FIG. 2A, and FIG. 2D shows a bottom perspective cross-sectional view of the clamp assembly 200 of FIG. 2A, according to certain embodiments. The clamp assembly 200 shown in FIGS. 2A-2D is configured similarly to clamp assembly 100 and includes a main clamp 210, a sub-clamp 220, a gasket 230, and a leaf spring 240. The sub-clamp 220 includes the gasket 230 proximate to a tapered inner edge 222, where the gasket 230 contacts the substrate 102. The sub-clamp 220 is coupled to the main clamp 210 via a bushing 244 and the leaf spring 240 by a fastener 106 within slots 212. The bushing 244 is disposed coaxially about the fastener 106 and coupled to the sub-clamp 220 through a main clamp aperture 214. The bushing 244 is disposed between the sub-clamp 220 and the leaf spring 240 and at least partially within the main clamp aperture 214 to allow smooth displacement or translation of the fastener 106 through the main clamp aperture 214.

As shown in FIGS. 2C and 2D, the leaf springs 240 may be arranged in arrays 242*c* and 242*d* similar to arrays 142*c* and 142*d*, except that the leaf springs 240 are arranged such that the length, the greater of the three dimensions of the leaf spring 240, is parallel to a corresponding proximate edge of the substrate 102 and to the inner edge 122 of the sub-clamp 120.

When the gasket 230 contacts the substrate 102, the substrate 102 places an upward force on the gasket 230 and the sub-clamp 220, causing the sub-clamp 220 to displace vertically upward. As the sub-clamp 220 displaces, the bushing 244 slides upward through the main clamp aperture 214 causing the leaf spring 240 to contact the back of the slot 212. As the bushing 244 continues to slide upward, the leaf spring 240 then applies a reactive spring force downward through the fastener 106 to the sub-clamp 220 and the gasket 230 and subsequently to the substrate 102. This reactive spring force then secures the substrate 102 to the substrate support 104. The reactive spring force is strong enough to secure the substrate 102 without damaging it.

Figure 3A:
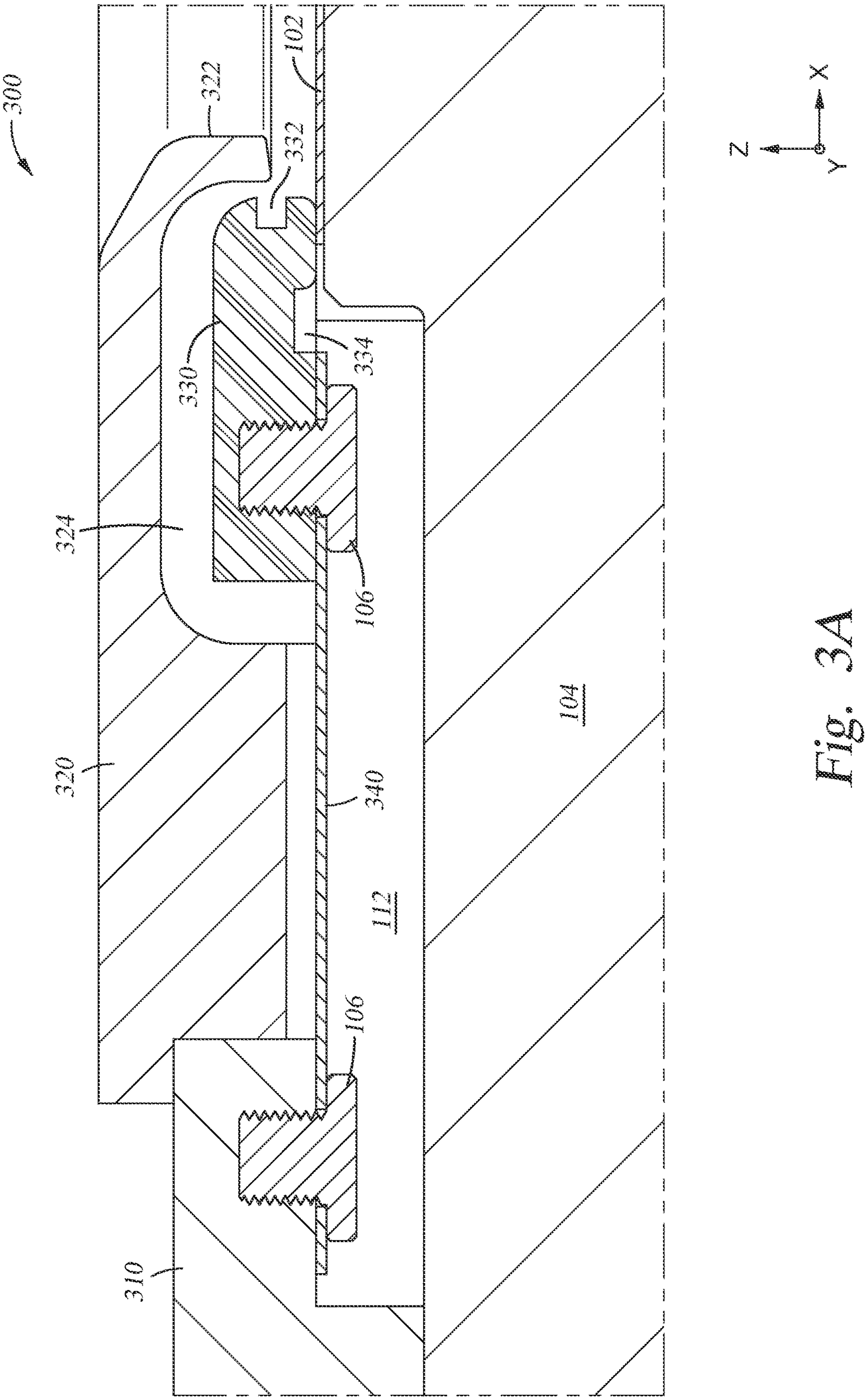
FIG. 3A shows a cross-sectional view of a clamp assembly, according to certain embodiments.
Figure 3B:
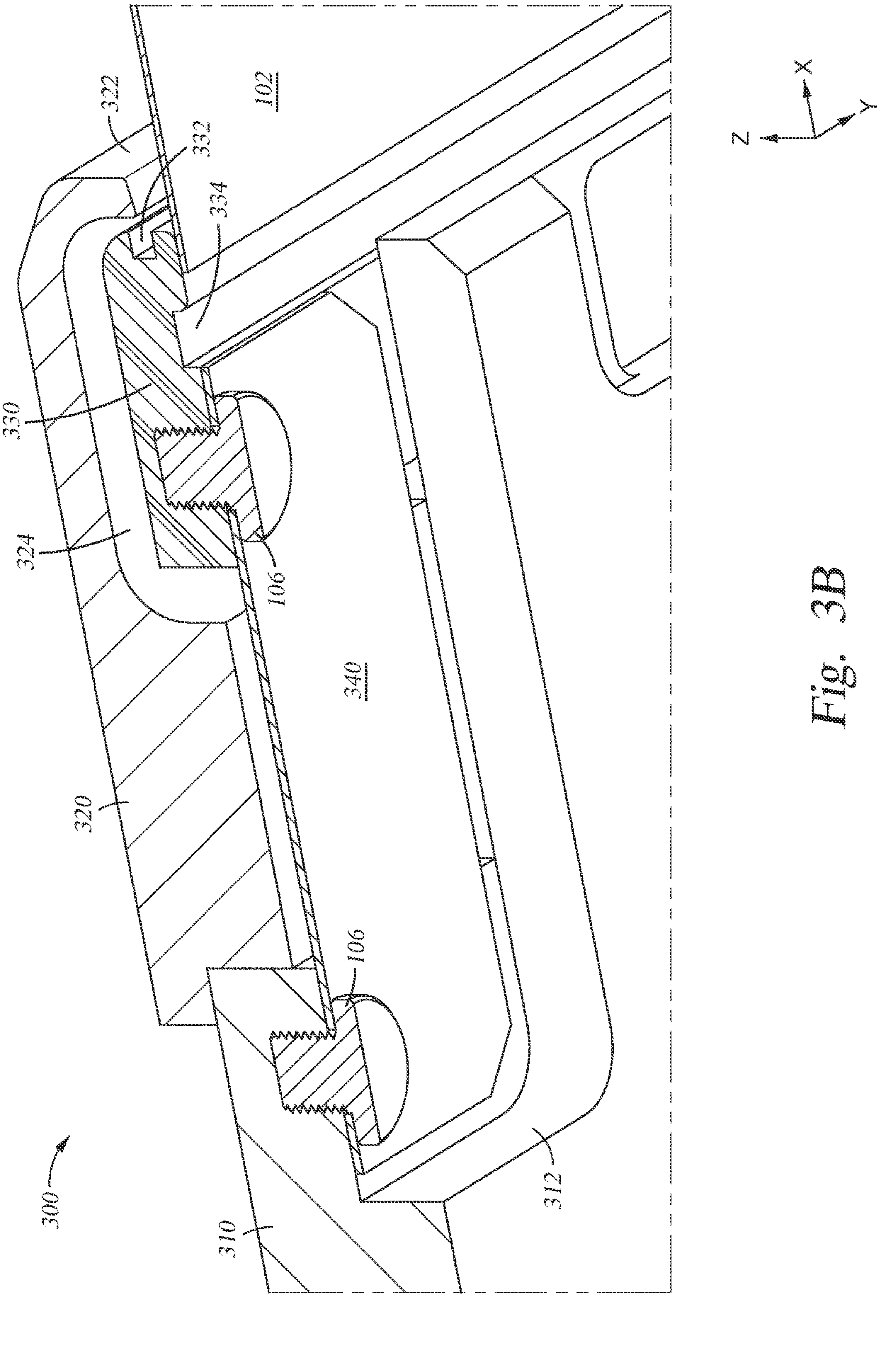
FIG. 3B shows a perspective cross-sectional bottom view of the clamp assembly of FIG. 3A, according to certain embodiments.

In FIGS. 3A and 3B, a cross-sectional view and a perspective cross-sectional view of a clamp assembly 300 is shown. Like clamp assembly 100, the clamp assembly 300 includes a main clamp 310, a sub-clamp 320 having a tapered inner edge 322, a gasket 330, and a leaf spring 340 used to secure the substrate 102 to the substrate support 104 and joined together using fasteners 106.

The sub-clamp 320 includes a sub-clamp recess 324 proximate to the gasket 330. The sub-clamp recess 324 allows the gasket 330 to displace upward into the sub-clamp 320 and deform the leaf spring 340 with pressure from the upward displacement. This sub-clamp recess 324 allows for a greater degree of motion for the gasket 330 to displace while maintaining the tapered inner edge 322 of the sub-clamp near the substrate 102.

The gasket 330 includes a gasket slot 332 along an outer edge proximate the tapered inner edge 322 and closest to the substrate 102. The gasket slot 332 allows for reduced gasket 330 weight, resulting in less pressure applied to the substrate 102. The gasket 330 may also include a gasket groove 334 on a lower surface of the gasket 330. The gasket groove 334 recessed into the gasket 330, allows the gasket 330 to maintain the desired gasket contact surface with the substrate 102 while reducing the weight of the gasket 330 to reduce the pressure applied to the substrate 102.

Advantageously, the only weight imposed on the substrate 102 is the weight of the gasket 330 and any reactive spring force applied by the leaf spring 340 through the gasket 330. This removes unnecessary pressure on the edges of the substrate 102, reducing potential damage. Further, as the gasket 330 and the leaf spring 340 are the only components that displace in the clamp assembly 300, the height of the clamp assembly 300 remains the same, reducing the shadowing effect imposed by the clamp assembly 300 during deposition. Additionally, the use of the leaf spring 340 reduces particle generation while using the clamp assembly 300.

Figure 4A:
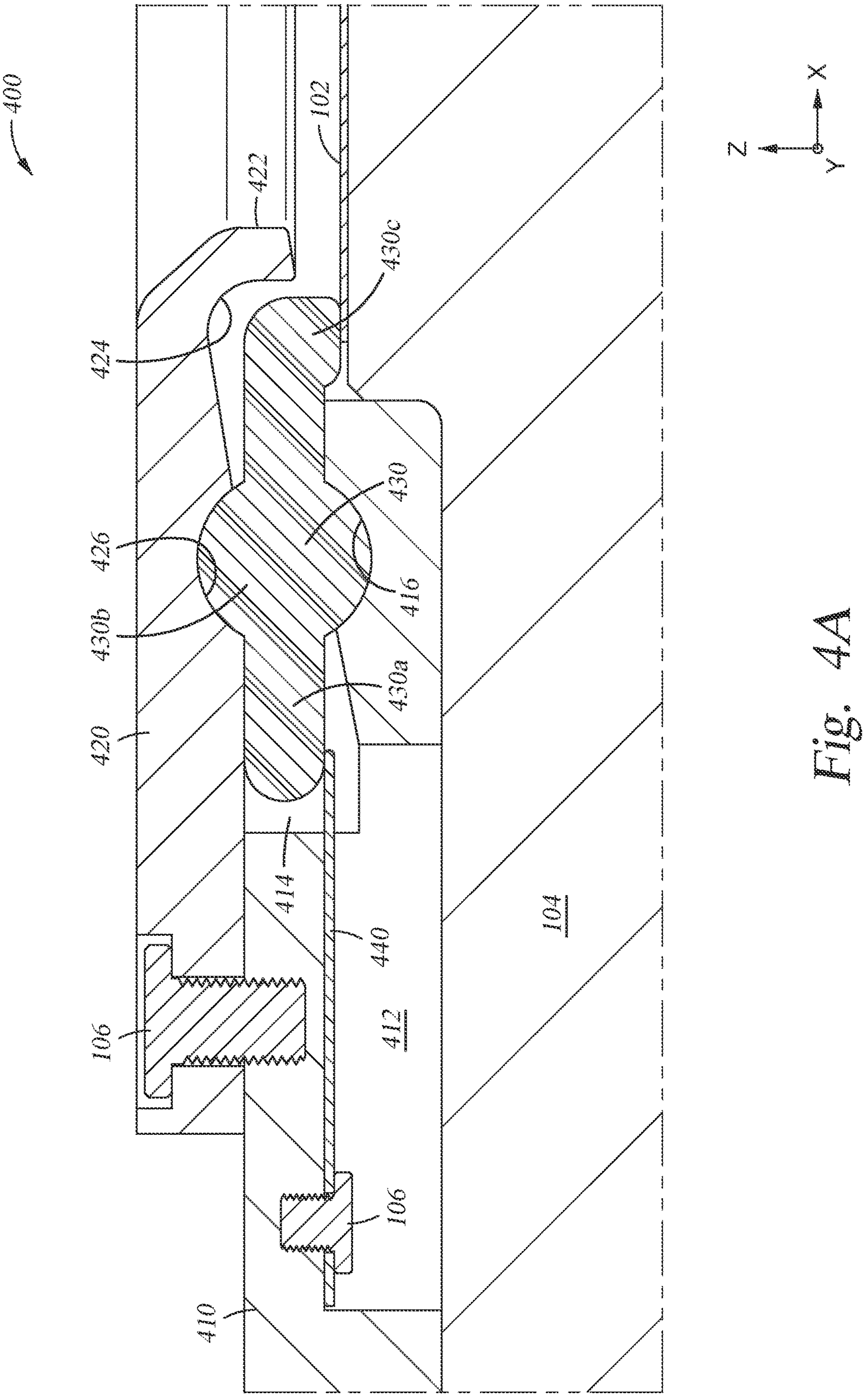
FIG. 4A shows a cross-sectional view of a clamp assembly, according to certain embodiments.
Figure 4B:
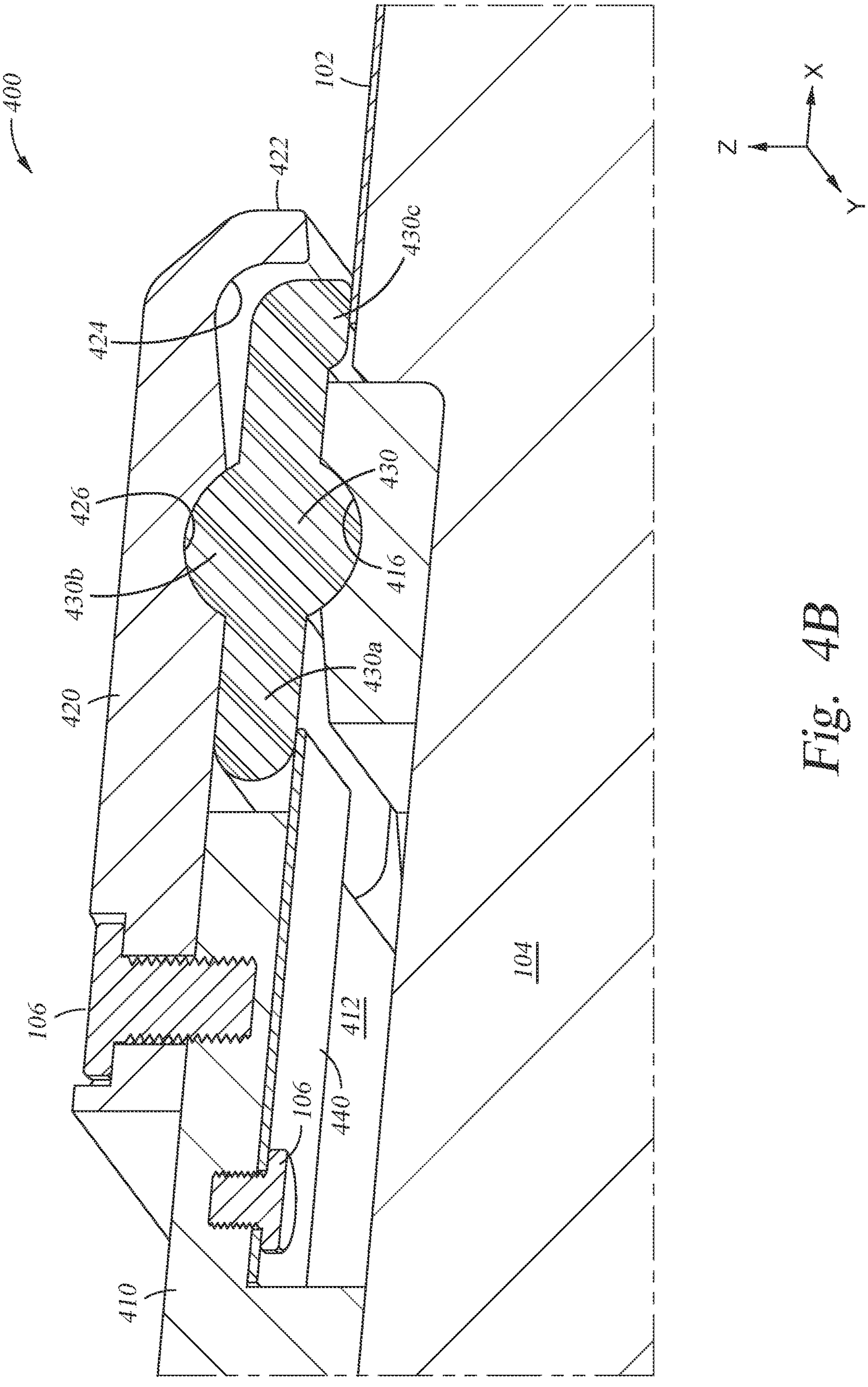
FIG. 4B shows a perspective cross-sectional bottom view of the clamp assembly of FIG. 4A, according to certain embodiments.
Figure 4C:
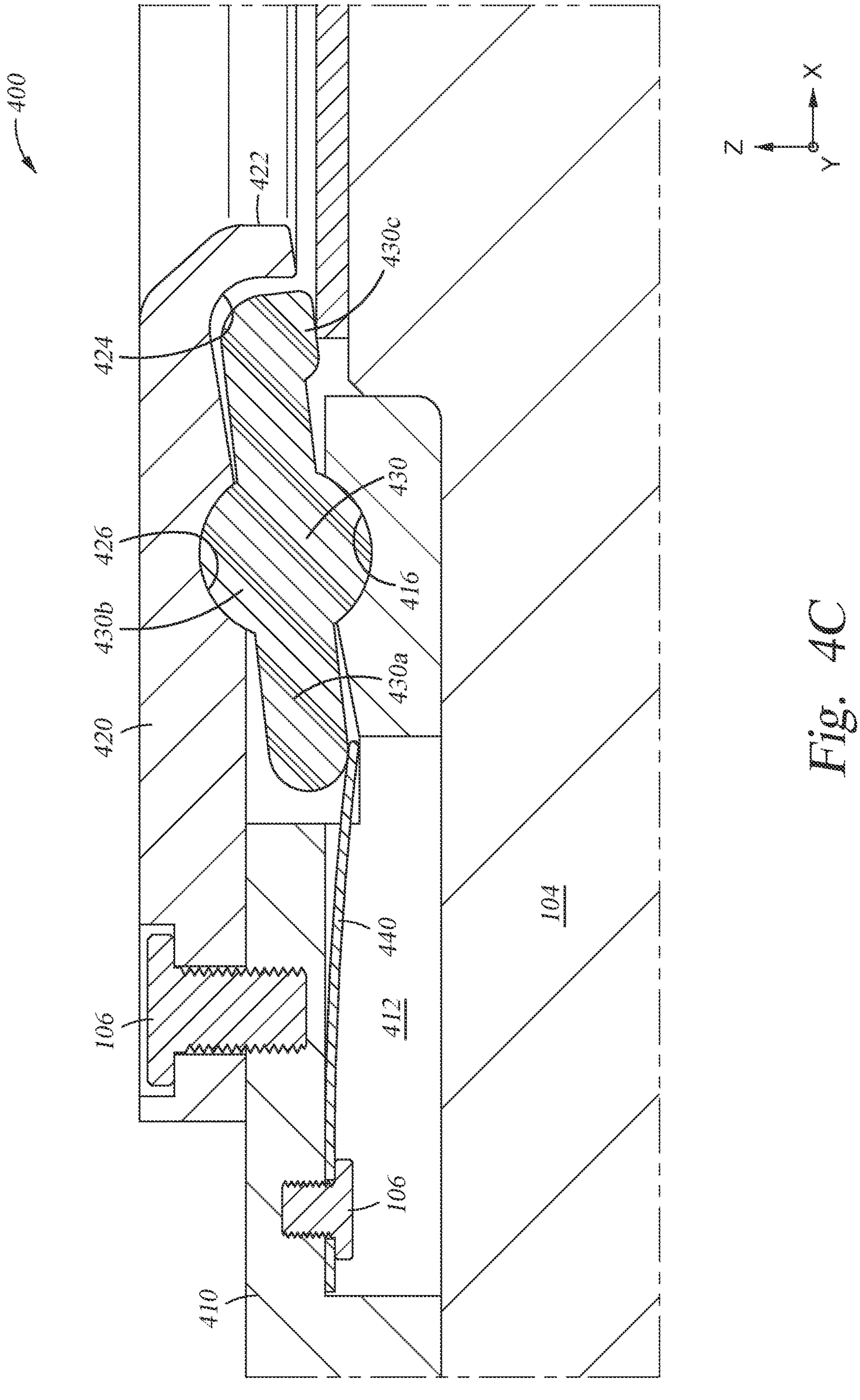
FIG. 4C shows a cross-sectional view of the clamp assembly of FIG. 4A when engaged, according to certain embodiments.

FIGS. 4A-4C illustrate cross-sectional views of a clamp assembly 400. In particular, FIG. 4C shows the clamp assembly 400 when it is engaged with the substrate 102. The clamp assembly 400 includes a main clamp 410, a sub-clamp 420, a gasket 430, and a leaf spring 440. The sub-clamp 420 is attached to the main clamp 410 via a first fastener 106*a* at one point and the leaf spring 440 is attached to the main clamp 410 via a second fastener 106*b* at a different point, such that the sub-clamp 420 and the leaf spring 440 are not coupled together directly. This allows for the clamp assembly 400 to maintain the same vertical position during operation, reducing the height profile of the clamp assembly 400 to mitigate the shadowing effect.

The main clamp 410 includes a slot 412 to allow access to the fastener 106 and the leaf spring 440 from below and a main clamp recess 414 adjacent to the gasket 430. The main clamp recess 414 is configured to receive a portion of the gasket 430 and allow motion of the gasket 430 within the main clamp recess 414. A portion of the leaf spring 440 protrudes into the main clamp recess 414 and is in direct contact with the gasket 430.

The gasket 430 includes an oblong portion 430*a* extending from one side of a cylindrical portion 430*b* and a hooked oblong portion 430*c* extending coaxially from an opposing side of the cylindrical portion 430*b*. The cylindrical portion 430*b* rests on a main clamp groove 416 such that the cylindrical portion 430*b* may rotate about the main clamp groove 416. An opposing side of the cylindrical portion 430*b* contacts a sub-clamp groove 426 and at least partially supports the sub-clamp 420. The sub-clamp 420 includes a sub-clamp recess 424 proximate to a hooked oblong portion 430*c* of the gasket 430 and an inner edge 422 of the sub-clamp 420.

When the clamp assembly 400 engages with the substrate 102, the substrate 102 contacts a surface of the hooked oblong portion 430*c* of the gasket 430, causing the gasket 430 to rotate about the main clamp groove 416 and the sub-clamp groove 426. This rotation causes the oblong portion 430*a* to exert a downward force on the leaf spring 440, deforming the leaf spring 440 in relation to the rotation, and resulting in the leaf spring 440 exerting an upward reactive spring force on the oblong portion 430*a*. The hooked oblong portion 430*c* also rotates upward into the sub-clamp recess 424 as a result of the applied pressure from the substrate 102. The rotation of the gasket 430 as a result of the force applied by the substrate 102 ceases when either the leaf spring 440 exerts a reactive spring force equal to the substrate force or when the hooked oblong portion 430*c* contacts the surface of the sub-clamp recess 424.

The leaf spring 440 configuration along with the rotating gasket 430 and recessed sub-clamp 420 allows for substrates 102 of varying thicknesses to be secured while minimizing the clamp assembly 400 profile as the sub-clamp 420 does not displace upward, reducing the shadowing effect by the clamp assembly 400.

Figure 5:
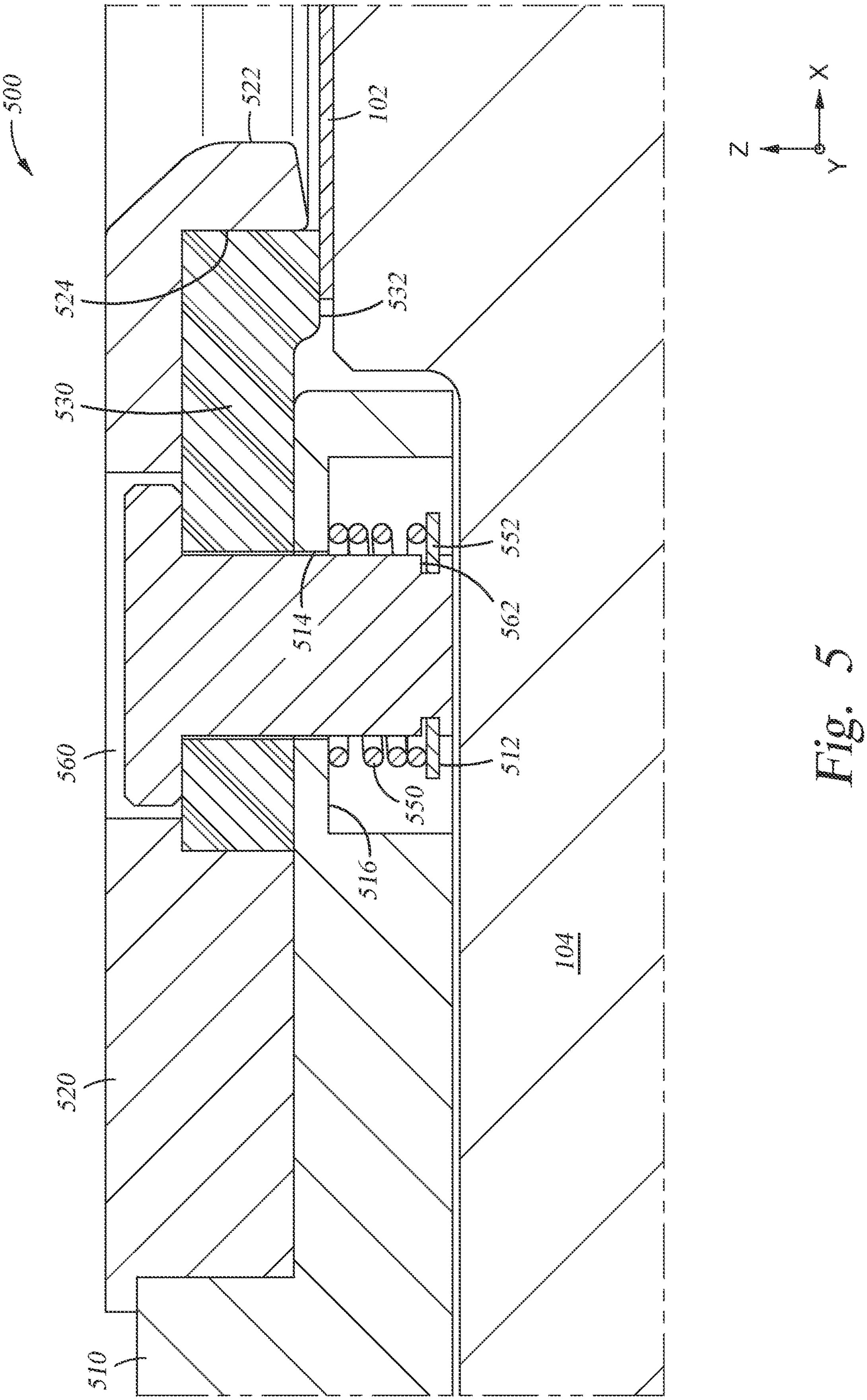
FIG. 5 shows a cross-sectional view of a clamp assembly, according to certain embodiments.

FIG. 5 shows a cross-sectional view of a clamp assembly 500, according to certain embodiments. The clamp assembly 500 includes a main clamp 510, a sub-clamp 520, a gasket 530 with a gasket contact surface 532, and a fastener 560 to secure the substrate 102 to the substrate support 104. The fastener 560 secures the sub-clamp 520 and gasket 530 to the main clamp 510. The main clamp 510 includes a main clamp recess 512 which houses a compression spring 550 coaxially coupled to the fastener 560 via a clip 552 mounted within a fastener slot 562 at a distal portion of the fastener 560. The fastener 560 protrudes into the main clamp recess 512 through an aperture 514 in the main clamp recess 512.

The sub-clamp 520 includes an inner edge 522 closest to the substrate 102 that is tapered. The inner edge 522, when the clamp assembly 500 is engaged with the substrate 102, produces a small gap between the sub-clamp 520 and the substrate 102, protecting the gasket 530 from exposure to the deposition process, thus reducing gasket particle contamination and prolonging the life of the gasket 530.

As the substrate 102 applies a pressure on the gasket contact surface 532, the gasket 530 displaces the sub-clamp 520 and the fastener 560 such that the fastener 560 slides through the aperture 514 causing the compression spring 550 to contact a back surface 516 of the main clamp recess 512. As the compression spring 550 contacts the back surface 516, the compression spring 550 becomes increasingly compressed as the fastener 560 displaces upward through the aperture 514 resulting in an increasingly stronger reactive spring force applied to the distal portion of the fastener 560 by the compression spring 550. The displacement of the fastener 560 ceases when the reactive spring force is equal to the pressure applied by the substrate 102 to the gasket contact surface 532.

Figure 6:
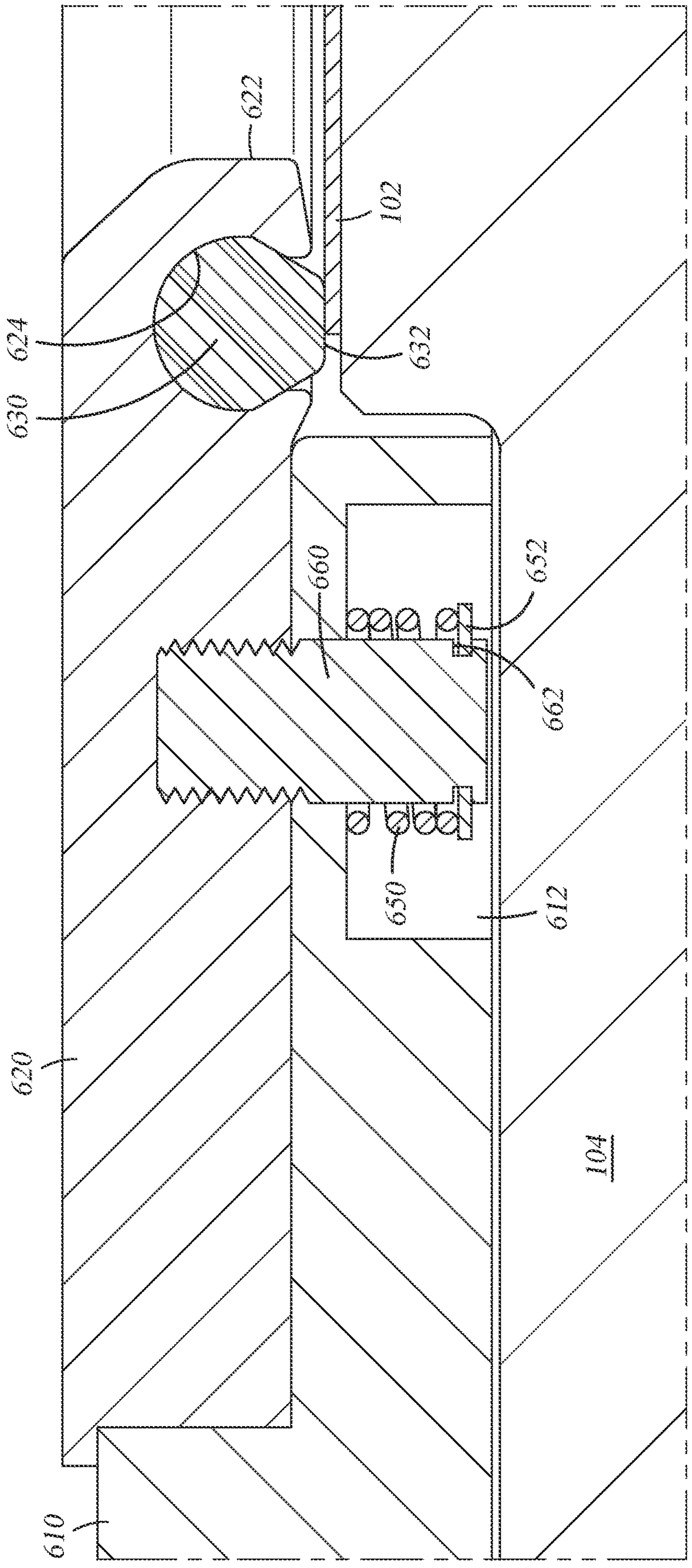
FIG. 6 shows a cross-sectional view of a clamp assembly, according to certain embodiments.
Figure 6:
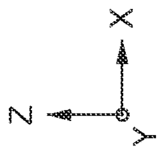

FIG. 6 shows a cross-sectional view of a clamp assembly 600, according to certain embodiments. The clamp assembly 600 as shown in FIG. 6 is similarly configured to the clamp assembly 500 of FIG. 5. The clamp assembly 600 includes a main clamp 610, a sub-clamp 620, a gasket 630, a compression spring 650, and a fastener 660. The fastener 660 secures the sub-clamp 620 to the main clamp 610, but does not secure the gasket 630 to the sub-clamp 620 or main clamp 610. This allows for the clamp assembly 600 to maintain the same vertical position during operation, reducing the height profile of the clamp assembly 600 to mitigate the shadowing effect.

The sub-clamp 620 includes an inner edge 622 closest to the substrate 102 that is tapered. The inner edge 622, when the clamp assembly 600 is engaged with the substrate 102, produces a small gap between the sub-clamp 620 and the substrate 102, protecting the gasket 630 from exposure to the deposition process, thus reducing gasket particle contamination and prolonging the life of the gasket 630.

The gasket 630 is secured into a sub-clamp recess 624 near the inner edge 622 such that a gasket contact surface 632 protrudes from the sub-clamp recess 624. The gasket 630 is shaped such that the weight of the gasket 630 is minimized, reducing pressure through the gasket contact surface 632 onto the substrate 102.

The main clamp 610 includes a main clamp recess 612 that houses the compression spring 640. The compression spring 640 is coaxially coupled to the fastener 660 via a fastener slot 662 at a distal portion of the fastener 660. The fastener 660 protrudes through the main clamp recess 612 and into the body of the sub-clamp 620.

When the clamp assembly 600 engages with the substrate 102, the substrate 102 applies a force through the gasket contact surface 632 which upwardly displaces the gasket 630, the sub-clamp 620, and the fastener 660. This displacement compresses the compression spring 640, resulting in a reactive spring force applied to the fastener 660, the sub-clamp 620, and the gasket 630. The upward displacement of the fastener 660, sub-clamp 620, and gasket 630 ceases when the reactive spring force is equal to the force applied by the substrate 102. This reactive spring force secures the substrate 102 to the substrate support 104 without damaging the substrate 102.

Figure 7:
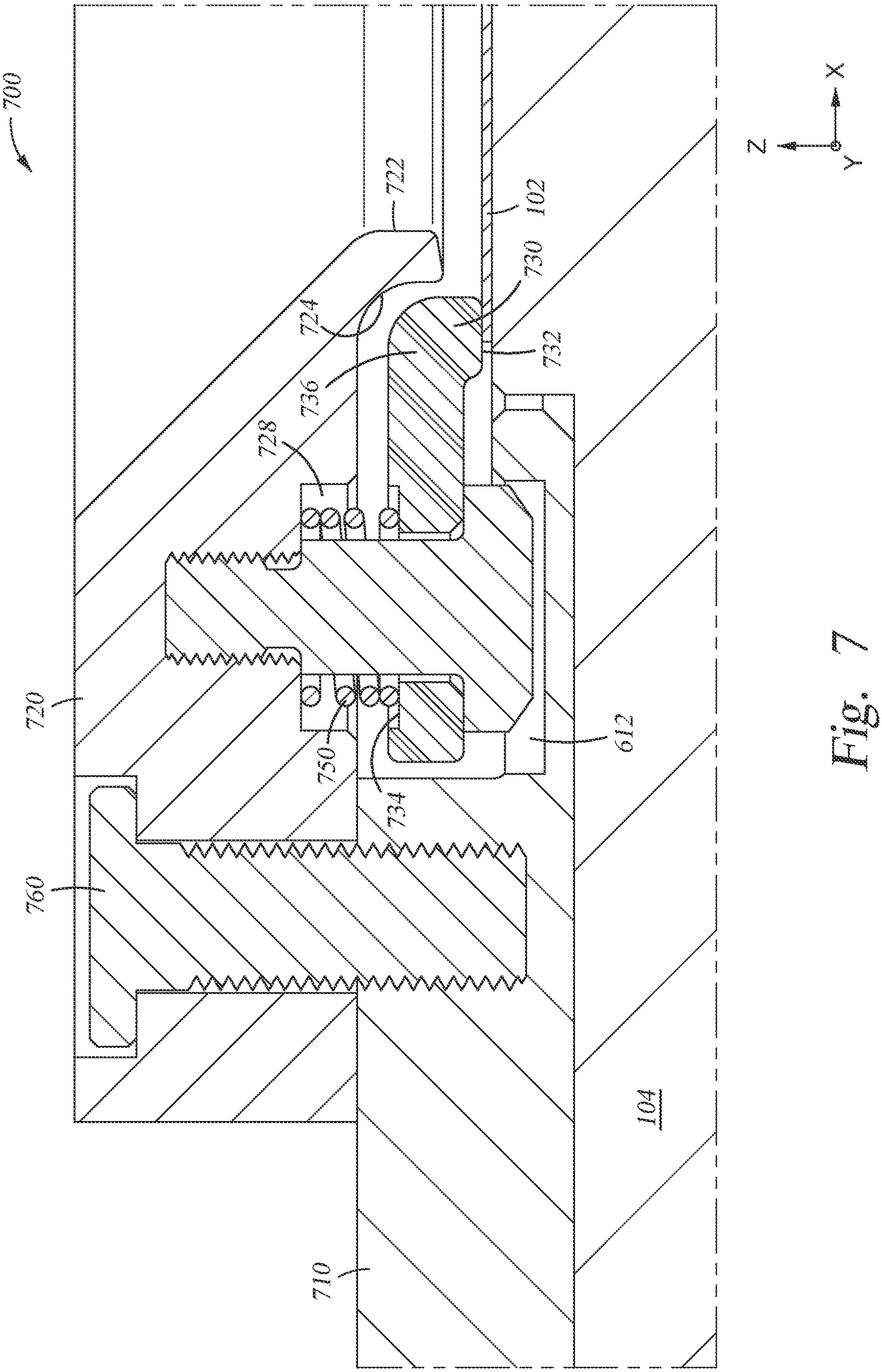
FIG. 7 shows a cross-sectional view of a clamp assembly, according to certain embodiments.

A cross-sectional view of a clamp assembly 700 is shown in FIG. 7. The clamp assembly 700 includes a main clamp 710, a sub-clamp 720, a gasket 730, a compression spring 750, a first fastener 760, and a second fastener 762. The first fastener 760 secures the sub-clamp 720 to the main clamp 710 and is stationary. This allows for the clamp assembly 700 to maintain the same vertical position during operation, reducing the height profile of the clamp assembly 700 to mitigate the shadowing effect.

The second fastener 762 secures the gasket 730 to the sub-clamp 720. The compression spring 750 is concentrically aligned to the second fastener 762 and contacts the gasket 730 through a gasket recess 734 and the sub-clamp 720 through a sub-clamp recess 726. The sub-clamp 720 includes a sub-clamp groove 724 matching the curvature of a hooked portion 736 of the gasket 730.

As the clamp assembly 700 engages with the substrate 102, the gasket 730 contacts the substrate 102 via a gasket contact surface 732. The force applied by the substrate 102 displaces the gasket 730 upward, applying a compressive force to the compression spring 750. The compression spring 750 subsequently applies a reactive spring force to the gasket 730 via the gasket recess 734. The gasket 730 displacement ceases either when the reactive spring force matches the force applied by the substrate 102 or when the gasket 730 contacts the sub-clamp groove 724. The clamp assembly 700 limits the weight of the assembly in contact with the substrate 102 to be only the weight of the gasket 730, reducing unnecessary pressure on the substrate 102 at the gasket contact surface 732.

The present disclosure provides systems and methods for improved securing of a substrate during a PVD process. More specifically, the present disclosure provides a clamp assembly that includes a main clamp, a sub-clamp, and different spring arrangements. The sub-clamp may be secured to the main clamp either directly, via the spring, or a combination of both. The sub-clamp includes a gasket comprising of a polymer material such as PEEK with a contact surface that contacts the substrate. The contact surface of the gasket is wide enough to reduce the pressure placed on the substrate when securing it while maintaining the force required to maintain the position of the substrate on the substrate support. The PEEK material of the gasket also reduces the contamination that the gasket contributes to the substrate surface. The sub-clamp also includes a tapered nose on an inner edge closest to the substrate. The tapered nose on the inner edge reduces the shadowing effect on the edges of the substrate, prevents cracking and arcing of the sub-clamp with the substrate, and reduces the amount of deposition on the gasket.

When introducing elements of the present disclosure or exemplary aspects or embodiments thereof, the articles "a," "an," "the" and "said" are intended to mean that there are one or more of the elements.

The terms "comprising," "including" and "having" are intended to be inclusive and mean that there may be additional elements other than the listed elements.

The term "coupled" is used herein to refer to the direct or indirect coupling between two objects. For example, if object A physically touches object B and object B touches object C, the objects A and C may still be considered coupled to one another—even if objects A and C do not directly physically touch each other. For instance, a first object may be coupled to a second object even though the first object is never directly in physical contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A clamp assembly for securing a substrate in a processing chamber, comprising:
- a main clamp;
- a sub-clamp having a tapered inner edge;
- a gasket disposed within the sub-clamp, the gasket being proximate to the tapered inner edge comprising a gasket contact surface configured to contact a substrate;
- a leaf spring secured to the sub-clamp by at least one of a plurality of fasteners; and
- a bushing disposed between the leaf spring and the sub-clamp such that the bushing is disposed within a main clamp aperture, the bushing configured to displace along with the sub-clamp.

2. The clamp assembly of claim 1, wherein the leaf spring is secured to the main clamp by another of the plurality of fasteners and configured to deform as the gasket displaces upward.

3. The clamp assembly of claim 1, wherein the leaf spring is one of a plurality of leaf springs disposed in a first array along an edge of the clamp assembly, wherein a length of the leaf spring is perpendicular to the tapered inner edge of the sub-clamp.

4. The clamp assembly of claim 3, wherein the first array comprises between about 5 and about 15 leaf springs.

5. The clamp assembly of claim 1, wherein the leaf spring is one of a plurality of leaf springs disposed in an array along an edge of the clamp assembly, wherein a length of the leaf spring is parallel to the tapered inner edge of the sub-clamp.

6. The clamp assembly of claim 1, wherein the bushing is disposed coaxially about the at least one of a plurality of fasteners and coupled to the sub-clamp.

7. The clamp assembly of claim 1, wherein the gasket contact surface has a width greater than a cross-sectional height of the gasket.

8. The clamp assembly of claim 1, wherein the bushing is disposed coaxially about the at least one of a plurality of fasteners and coupled to the sub-clamp through a main clamp aperture.

9. The clamp assembly of claim 8, wherein the bushing is disposed between the sub-clamp and the leaf spring and at least partially within the main clamp aperture to allow displacement or translation of the fastener through the main clamp aperture.

10. The clamp assembly of claim 8, wherein when the sub-clamp displaces, the bushing slides upward through the main clamp aperture.

11. The clamp assembly of claim 10, wherein when the bushing slides upward through the main clamp aperture, the leaf spring applies a reactive spring force downward through the at least one of a plurality of fasteners to the sub-clamp and the gasket.

* * * * *